United States Patent [19]

Bartha et al.

[11] Patent Number: 5,641,610
[45] Date of Patent: *Jun. 24, 1997

[54] METHOD FOR PRODUCING A MULTI-STEP STRUCTURE IN A SUBSTRATE

[75] Inventors: Johann Bartha, Aidlingen-Dachtel; Johann Greschner, Pliezhausen; Karl Heinz Probst, Kornwestheim; Gerhard Schmid, Leinfelden-Echterdingen, all of Germany

[73] Assignee: International Business Machines Corporation, Armonk, N.Y.

[*] Notice: The term of this patent shall not extend beyond the expiration date of Pat. No. 5,635,337.

[21] Appl. No.: 640,647

[22] Filed: May 1, 1996

Related U.S. Application Data

[63] Continuation of Ser. No. 57,729, May 5, 1993.

[30] Foreign Application Priority Data

May 20, 1992 [EP] European Pat. Off. ............ 92108484

[51] Int. Cl.$^6$ ...................................................... G03F 7/00
[52] U.S. Cl. .................. 430/313; 430/317; 430/323; 430/329
[58] Field of Search ........................ 430/313, 314, 430/317, 323, 324, 329; 156/643.1, 644.1, 646.1, 659.11, 660.1, 661.11

[56] References Cited

PUBLICATIONS

IBM Technical Disclosure, vol. 32, No. 8A, Jan. 1990, pp. 218–219, "Method to Incorporate Three Sets of Pattern Information in Two Photo–Masking Steps".

*Primary Examiner*—Kathleen Duda
*Attorney, Agent, or Firm*—Calfee, Halter & Griswold LLP

[57] ABSTRACT

A structure of openings is produced in two or more layers of silylated, polyimide photoresist. Openings in subsequent layers, which overlap previous openings, are of larger size. Then the structure is transferred to an organic substrate using oxygen plasma etching with up to 3% $CF_4$. The smallest opening transferred to the substrate extends through the substrate.

21 Claims, 6 Drawing Sheets

SECTION A-A

METHOD FOR PRODUCING A MULTI-STEP STRUCTURE IN A SUBSTRATE

This is continuation of application Ser. No. 08/057,729 filed on May 5, 1993.

BACKGROUND

The invention concerns a method for producing a multi-step structure in a substrate.

In many technical fields it is necessary to produce a step structure in a substrate. Single-step structures are generally produced by removing substrate with the aid of, for example, mechanical, physical or chemical processes. For larger numbers and higher accuracy requirements, photo-processes are frequently employed for defining the location of the step on the substrate. In such processes, a photoactive substance is deposited on the structure, exposed through a mask, and developed, so that areas for the removal of substrate are passivated or substrate is removed through a mask overlying the substrate during removal.

For producing a multi-step structure, a sequential approach is normally adopted. Initially, a single-step structure is formed, in which further steps are produced. This necessitates however that the first step in the substrate has a uniform depth so that irregularities existing therein are not repeated in the next steps. Apart from this, it is difficult with this approach to position the second photomask and inaccuracies may occur when the second step is formed in the substrate. Thus, this approach is only suitable for steps of a particular size for which the accuracy requirements are not too exacting.

Such step structures are frequently used for computer components, such as the wiring planes of semiconductor chips or the thin-film wiring on multilayer ceramic substrates.

As components of this type are being increasingly miniaturized and have to meet ever higher accuracy requirements, the previously described approach has reached its limits so that a new concept had to be found for producing such substrates.

From IBM Technical Disclosure Bulletin, Vol. 33, No. 2, July, 1990, p. 447 "Dual-Image Resist for Single-Exposure Self-Aligned Processing" a photoresist system is known which consists of a wet developable first and a dry developable second photoresist which are radiated at different wavelengths. Such a system may be used to fabricate step-shaped structures from a substrate by exposure to a first wavelength and development, followed by a second exposure, development and processing after the first opening has been formed. This approach is limited however since photoresists responsive to different wavelengths are expensive and the number of steps thus produced cannot be increased at random, not to mention the fact that the precision obtainable depends on how sensitive the second photoresist is to the first wavelength.

SUMMARY OF THE INVENTION

Therefore, it is the object of the invention to provide an inexpensive method by which finest multi-step structures can be produced in a substrate with great accuracy.

This object is accomplished by the method according to the invention comprising the steps of:

a) producing a substrate (1);

b) depositing a first photoresist layer (2) on the substrate (1);

c) forming a first opening (4) in the first photoresist layer (2) by exposure through a first mask (3), development and postbaking of the first photoresist layer (2);

d) depositing a second photoresist layer (5) on the first photoresist layer (2) and on the substrate (1) in the area of the first opening (4);

e) forming a second opening (7) in the second photoresist layer (5) by exposure through a second mask (6), development and postbaking, with said second opening (7) overlying and being larger than the first opening (4);

f) transferring the first opening (4) to the substrate (1);

g) removing the first photoresist layer (2) to the extent to which it is not covered by the overlying second photoresist layer (5) and simultaneously removing the topmost photoresist layer (5);

h) transferring the second opening (7) to the substrate (1) and simultaneously deepening the first opening (4) in the substrate (1);

i) removing the first photoresist layer (2).

By this method the topography problem that inevitably arises during the production of finest vertical steps in a substrate is shifted to thin layers to be applied to the smooth substrate surface, which are then sequentially processed.

An advantageous further development of the invention consists in steps f) and g) as well as h) and i) being carried out simultaneously. A method thus modified requires fewer steps.

It is also within the scope of the invention that after completion of step e) the following steps are carried out at least once:

d') depositing a further photoresist layer (8) on the existing photoresist layers (2, 5) and on the substrate (1) in the area of opening (4);

e') forming a further opening (10) in the further photoresist layer (8) by exposure through a mask (9), development and postbaking, with said further opening (10) overlying and being larger than the opening (7) in the photoresist layer (5); and that after completion of step h), the following steps are carried out at least once:

g') removing photoresist layer (2) to the extent to which it is not covered by the overlying photoresist layer (7) and simultaneously removing the top-most photoresist layer (5);

h') transferring the further opening (10) to the substrate (1) and simultaneously deepening the existing openings (4, 7) in the substrate (1).

In this way, an arbitrary number of steps can be formed in the substrate.

If the invention is used, for example, to produce conductors for computer components it may be expedient for the first opening (4) to extend through the substrate (1).

The invention is described in detail below with reference to drawings. Although the invention may be used for any technical applications requiring a multi-.step structure to be produced in a substrate, it will be described here by way of an example concerning the production of computer components.

DETAILED DESCRIPTION OF THE DRAWINGS

Figure 1A:
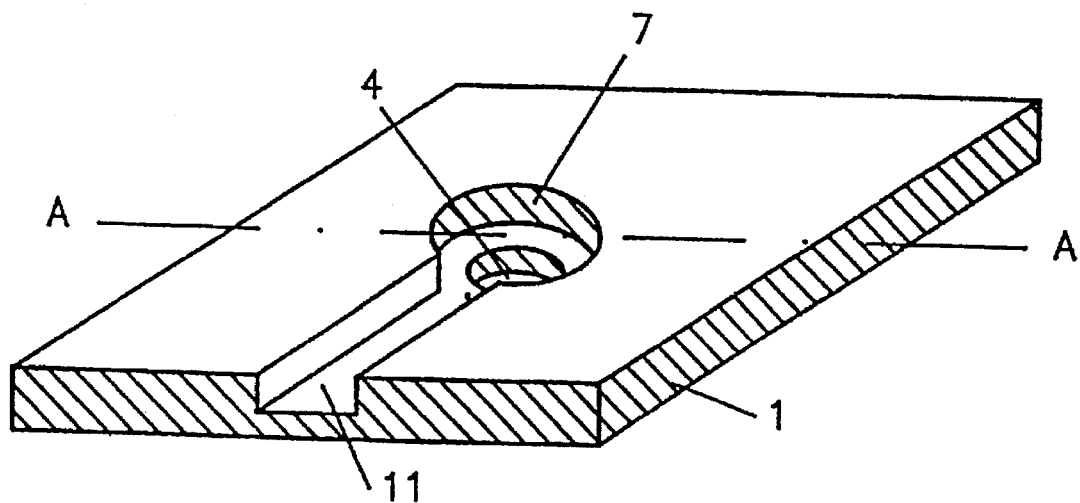
FIG. 1A is a perspective view of a multi-step structure producible by the method according to the invention.
Figure 1B:
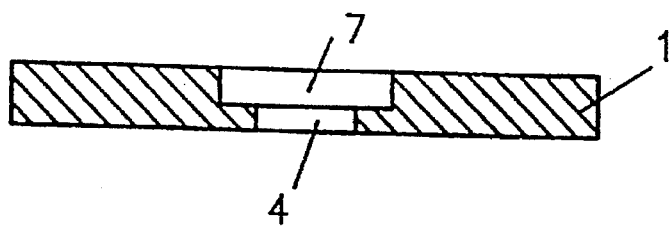
FIG. 1B is a sectional view along line A—A of the structure of FIG. 1A.
Figure 2A:
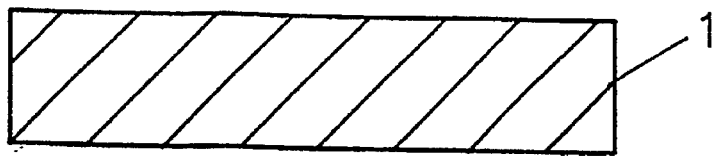
FIG. 2 shows a potential production sequence for a two-step structure.
Figure 2B:
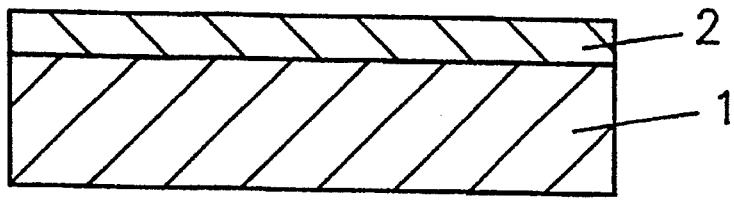
Figure 2C:
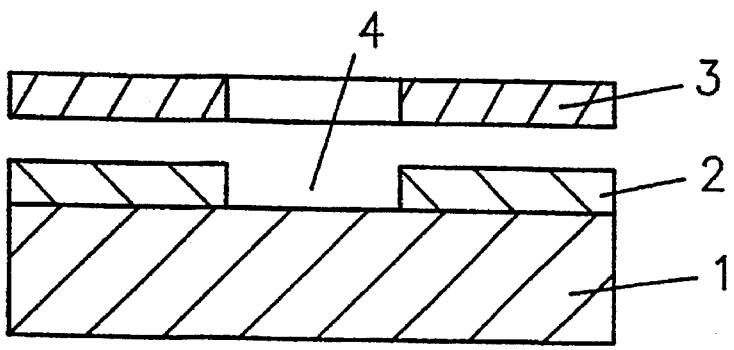
Figure 2D:
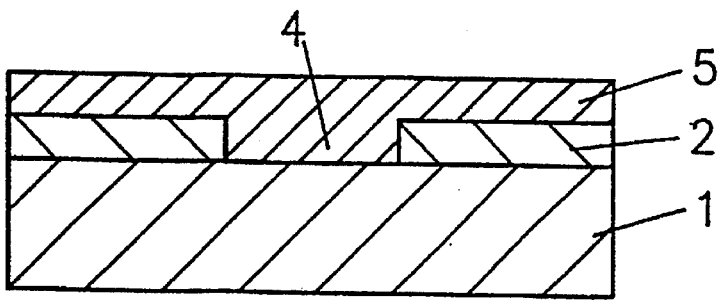
Figure 2E:
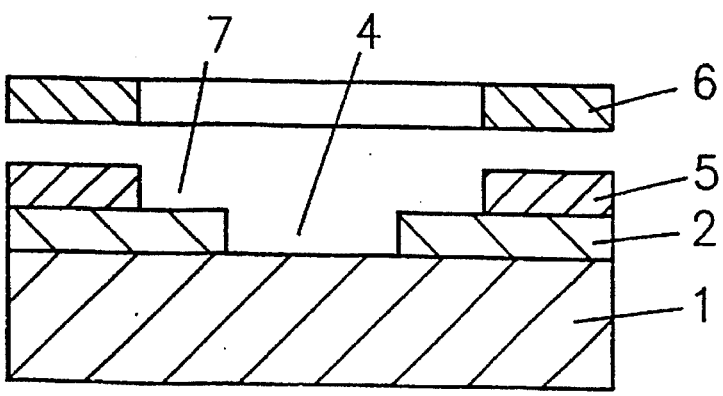
Figure 2F:
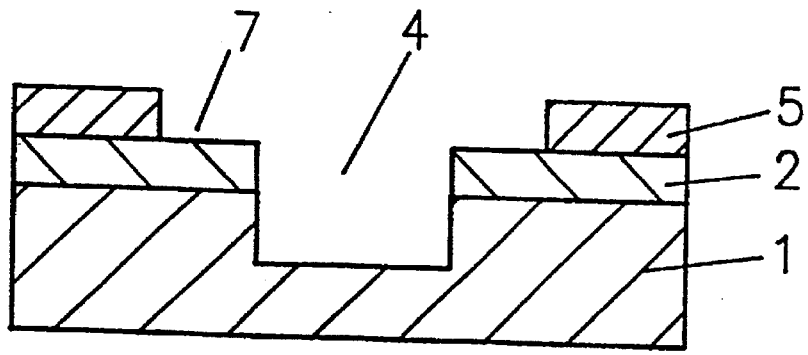
Figure 2G:
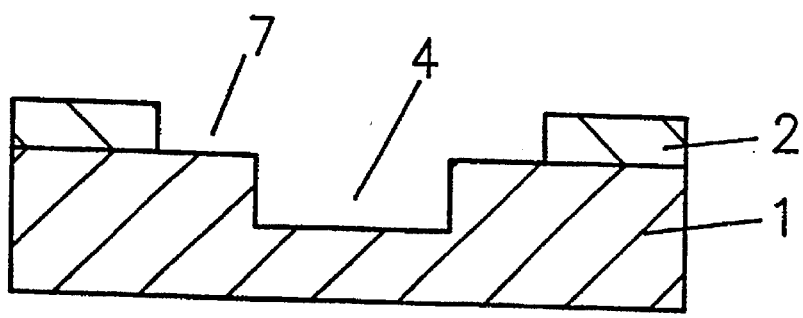
Figure 2H:
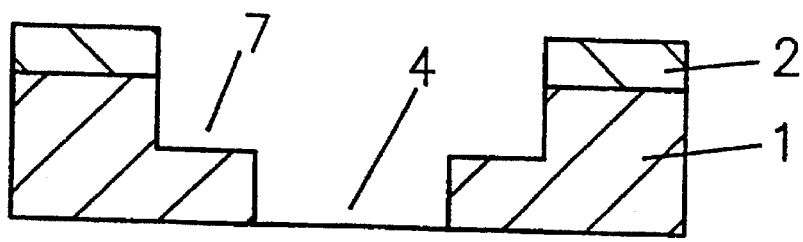
Figure 2I:
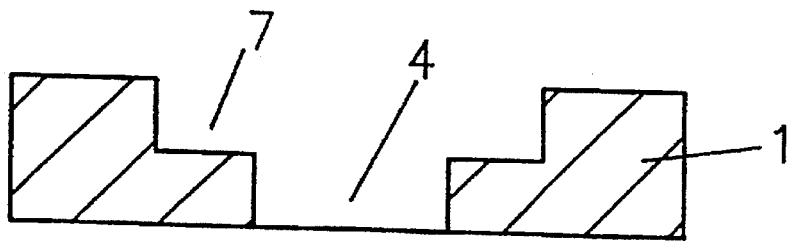
Figure 3A:
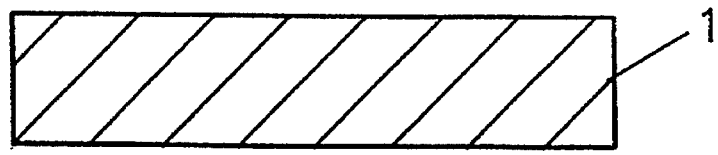
FIG. 3 shows a potential sequence for producing a three-step structure according to the invention.
Figure 3B:
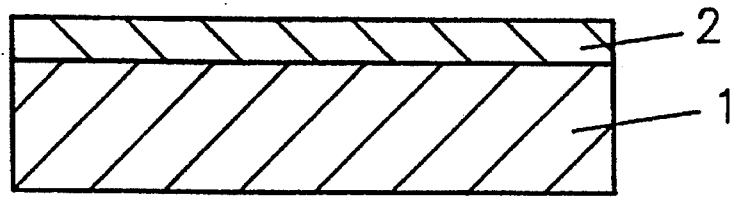
Figure 3C:
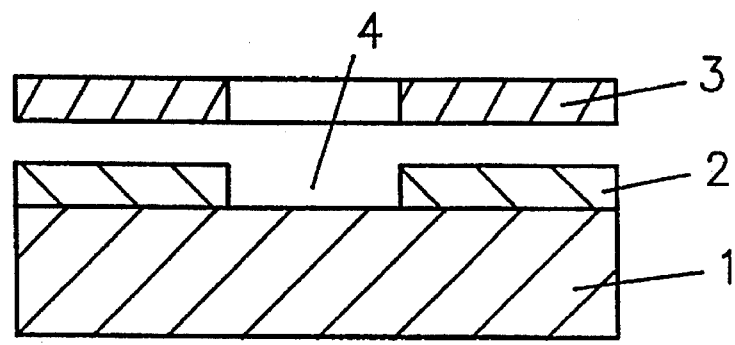
Figure 3D:
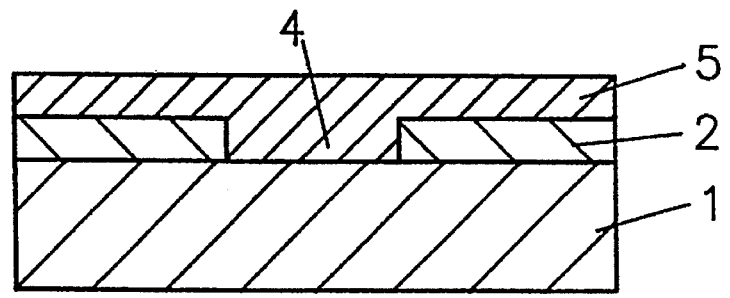
Figure 3E:
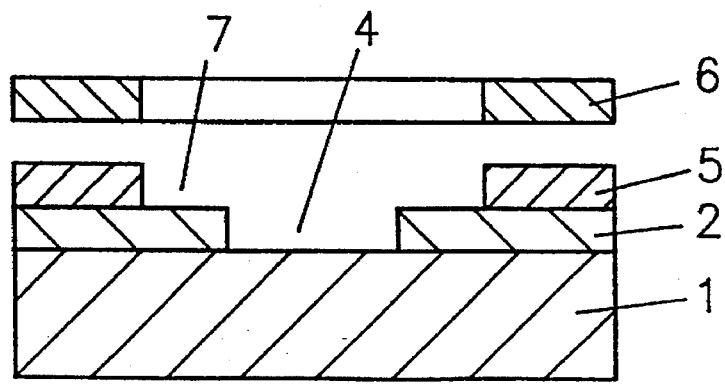
Figure 3D:
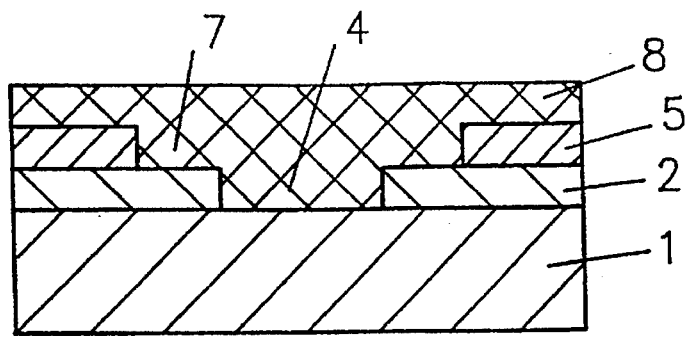
Figure 3E:
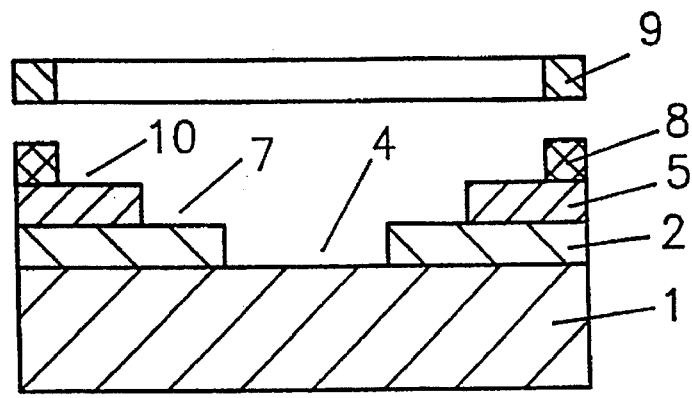
Figure 3F:
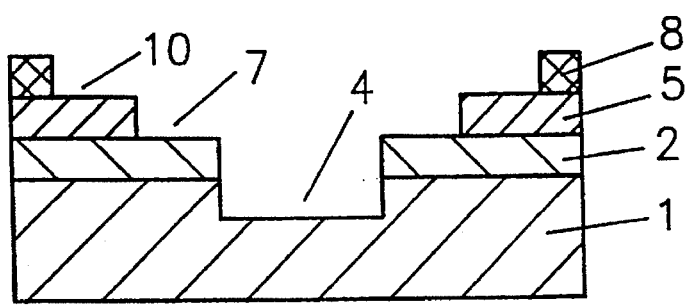
Figure 3G:
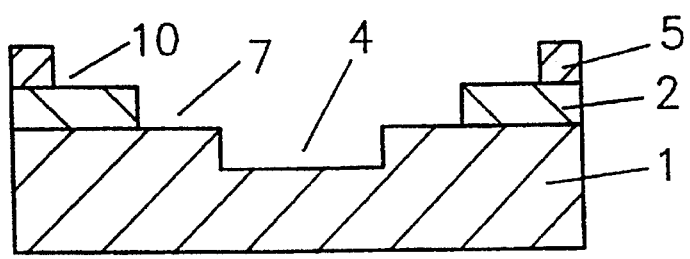
Figure 3H:
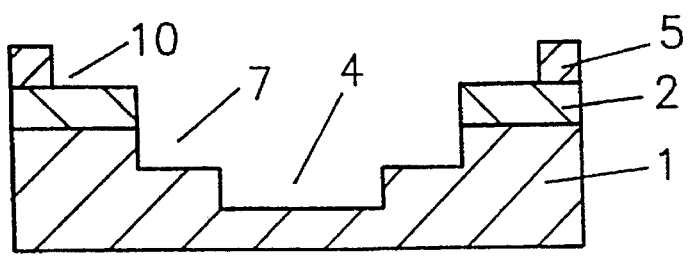
Figure 3G:
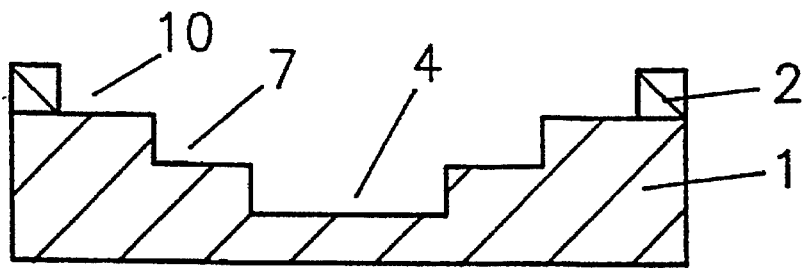
Figure 3H:
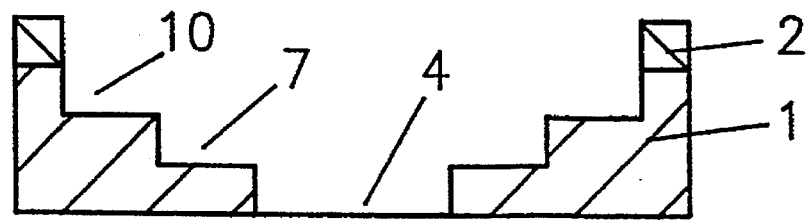
Figure 3I:
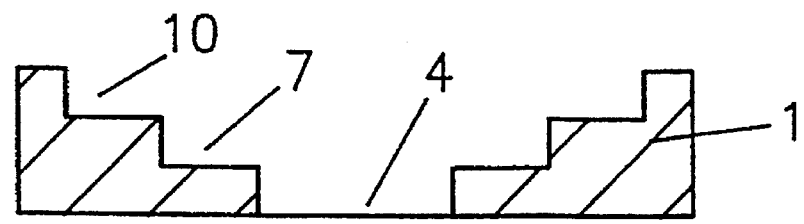

FIGS. 1A and 1B show a step structure formed in a substrate 1 by means of the inventive method. Substrate 1 contains a first opening 4 which leads to a second opening 7, with the latter opening 7 being wider than opening 4. Adjacent to opening 7, there is a trench 11 which is formed in substrate 1 simultaneously with opening 7. Openings 4 and 7 are shown to extend through substrate 1 down to substantially the same depth, although the method according to the invention is also suitable for forming non-continuous openings without debris and grass-like structures, with the depth and shape of each opening in the substrate being arbitrarily selectable.

For producing computer components, such multi-step structures are formed inter alia in wiring planes of semiconductor chips and in the thin-film wiring of multilayer ceramic substrates. According to FIGS. 1A and 1B, for example, a dielectric substrate 1 is used for such applications. In this substrate, a trench 11 is formed which, if filled with a conductive substance, constitutes a conductor. This conductor. must be connected through a via, i.e. openings 4 and 7 filled with conductive substance, to an underlying conductor.

FIGS. 2 and 3 show the method steps required according to the invention for producing such a substrate. FIG. 2 shows a method for producing a two-step structure and FIG. 3 a method for producing a structure with more than two steps by way of a three-step structure. The substrate 1 of step a) may consist of organic or inorganic material and must merely be removable by a mechanical, physical or chemical process which does not attack the photoresist layers. Owing to the relatively high selectivity they permit during removal compared to known photoresists, organic substrate materials are an obvious choice for this purpose. Such materials include a number of polymerized and non-polymerized materials, of which polyimide, for example, is particularly suitable. If the original surface is unsuited for the proposed approach, the substrate 1 may be deposited thereon in the form of a unworn layer.

This is the case, for example, during the production of multilayer ceramic substrates, where a layer of, say, polyimide, which may be planarized by micromilling in the solid state, is deposited as substrate 1 on the sintered glass ceramic substrate.

When substrate 1 has a planar surface, a first photoresist layer 2 is deposited thereon (step b). The choice of photoresist depends on substrate 1 and its removal. The photoresist must adhere well to substrate 1 and not be attacked, at least at the beginning of the removal process. Positive or negative working liquid or dry resists may be used for such applications.

For multilayer ceramic substrates, a conventional positive working photoresist is employed, for example. It may be advantageous in such cases to use a silylated photoresist or to silylate a positive resist after development in particular for an organic substrate material.

In step c), the photoresist layer 2 is exposed through a first mask 3 with at least one opening and then developed and postbaked.

On this first photoresist layer 2, a second photoresist layer 5 is also deposited (step d) in the area of the first opening 4 thus formed. This second photoresist layer 5 may consist of the same or another material than the first photoresist layer 2. The individual photoresist layers may have different thicknesses.

A second opening 7 larger than and overlying the first opening 4 is also formed in the second photoresist layer 5 by exposure through a second mask 6, development and postbaking (step e). In this manner, a double layer is obtained, whose first opening 4 and second opening 7 respectively correspond to the via and the conductor to be formed later on.

For forming more than two steps in the substrate, steps d) and e) are repeated (steps d' and e' in FIG. 3), thus producing a random number of photoresist layers with openings overlying each other. The double or multiple layer produced in this way is sequentially processed in the subsequent steps.

Initially, the first opening 4 is transferred to the substrate 1 (step f), using a mechanical, chemical or physical process suitable for removing substrate 1. For this purpose, a chemical or physical etch process may be employed. Thus, for example, dry etch steps which are extremely selective and uniform with respect to the photoresist layers, may be used to remove a polyimide substrate 1 without debris and grasslike structures at high etch rates. An oxygen plasma, for example, yields a uniformity exceeding 5%, so that an etch stop layer is not required.

Then the first photoresist layer, to the extent to which it is not covered by the overlying second photoresist layer 5, is simultaneously removed along with the latter layer (step g), so that the pattern of photoresist layer 5 is transferred to photoresist layer 2. For this purpose, any. available removal process is generally suitable. However, for the above-described material constellation it is expedient to change the etch gas and to use an etch gas containing a fluorine compound, such as $CF_4$. Such an etch gas removes even silylated photoresist layers with a high degree of uniformity.

Subsequently, in step h), the second opening 7 is transferred to the substrate, and the first opening 4 is formed down to the desired depth in substrate 1. Depending upon the application of the step structure, it may be expedient for the first opening 4 to extend through substrate 1, as, for instance, for conductors with a via connecting them to underlying conductors. The second opening may also be structured as a conductor and be transferred as such to the substrate. For step h), the same transfer process as for step f) is generally used.

When more than two photoresist layers have been deposited and structured, they are subsequently transferred to the substrate as additional steps by repeating steps g) and h) and then deepened (steps g' and h' in FIG. 3).

In a further step i), after the double or multiple layer has been processed, the remaining photoresist layer 2 is removed by a process as in step g).

Steps f) and g) as well as steps h) and i) may be carried out simultaneously by combining the removal processes required for them, for example, by admixing up to about 3% of a fluorine compound, such as $CF_4$, to an oxygen plasma or by removing the photoresist layer in a pure oxygen plasma.

As in the described anisotropic etch process the different etch steps on the photoresist layers and in the substrate are carried out by merely varying the etch gases, the removal tool does not have to be exchanged. Thus, the various etch steps required for implementing the method may be carried out in a plasma etch reactor of a more recent type operating at a very low pressure (below 10 microbar), such as a DECR (Distributed Electron Cyclotron Resonance) tool. If necessary, an ion beam etch step for removing a chromium layer may be carried out in the DECR tool on a pad below the substrate. The DECR tool yields a uniformity of about 1.5% and better.

By shifting the topography problem previously encountered during the production of finest step structures to thin layers which are deposited on a smooth surface and then selectively processed, it is possible to produce even minimum step structures for which laser ablation is unsuited. Thus, the method according to the invention permits integration densities which so far have been unobtainable for thin-film packaging products.

We claim:

1. Method for producing a substrate with a multistep structure, comprising the steps of:
   a) producing a substrate;
   b) depositing a first photoresist layer on top of the substrate;
   c) forming a first opening in the first photoresist layer by exposure through a first mask, development and post-baking of the first photoresist layer;
   d) depositing a second photoresist layer on top of the existing first photoresist layer and on top of the substrate in the area of the first opening;
   e) forming a second opening in the second photoresist layer by exposure through a second mask, development and postbaking, with said second opening overlying all of and being larger than the first opening;
   f) transferring substantially all of the first opening to the substrate;
   g) removing the first photoresist layer to the extent to which it is not covered by the overlying second photoresist layer and simultaneously removing substantially all of the second photoresist layer;
   h) transferring the second opening to the substrate and simultaneously deepening the first opening in the substrate; and
   i) removing the first photoresist layer.

2. Method of claim 1, in which at least parts of steps f) and g) are carried out simultaneously and at least parts of steps h) and i) are carried out simultaneously.

3. The method of claim 2 in which steps h) and i) continue to be carried out simultaneously after removal of the second photoresist layer.

4. Method of claim 1, in which after completion of steps a–e, the following steps are carried out at least once:
   depositing a further photoresist layer on top of the existing photoresist layers and on top of the substrate in the area of existing openings formed by previous steps; and
   forming a further opening in the further photoresist layer by exposure through a mask, development and postbaking, with said further opening overlying all of and being larger than the existing openings in photoresist layers;
   and that after completion of steps f–h, the following two steps are carried out at least once: removing the exiting photoresist layers to the extent to which they are not covered by overlying photoresist layers; and
   transferring the further opening to the substrate and simultaneously deepening the existing openings in the substrate.

5. Method according to claim 1, characterized in that at least one of the photoresist layers consists of a silylated photoresist selected from the group of: photoresists silylated after deposition and photoresists deposited as silylated photoresists.

6. Method of claim 1, wherein the substrate includes an organic material;
   wherein the first photoresist layer and the second photoresist layer include a silylated polyimde; and wherein the openings are transferred to the substrate while simultaneously removing the photoresist layers using oxygen plasma etching with an etching gas including up to about 3% $CF_4$, with the first opening transferred to the substrate extending through the substrate.

7. The method of claim 1 in which after step g at least part of the first photoresist layer is fully removed by etching prior to any extention of the structure through the substrate.

8. Method for producing a substrate with a multi-step structure comprising the steps
   producing a substrate;
   depositing a first photoresist layer on top of the substrate;
   forming a first opening in the photoresist layer;
   depositing a further photoresist layer on top of the first photoresist layer;
   forming a further opening in the further photoresist layer which is larger and overlay all of the opening in the first photoresist layer to build a multi-step opening structure in multiple photoresist layers; and
   then transferring the multi-step opening structure of the photoresist layers into the substrate to produce a substantially similar multi-step opening structure in the substrate.

9. Method of claim 8, in which the transferred multistep structure extends through the substrate.

10. Method of claim 8, characterized in which the substrate includes organic material.

11. Method of claim 8, in which the organic material of the substrate, includes an organic polymer.

12. Method of claim 11, in which the organic polymer includes polyimide.

13. Method of claim 8, in which the openings are transferred by etching steps and an etching gas used for the etching steps contains oxygen.

14. Method of claim 8, in which the openings are transferred by etching steps and an etching gas for the etching steps contains a fluorine compound.

15. Method of claim 14, in which the etching gas contains oxygen.

16. Method of claim 14, in which the etching gas contains less than about 3% of the fluorine compound.

17. Method of claim 14, in which the fluoride compound includes $CF_4$.

18. The method of claim 8, in which the further photoresist is etched to fully uncover the first photoresist layer, and then etching continues and the structure of the further opening of the further photoresist is transferred to the substrate.

19. The method of claim 8 in which the material of the first photoresist layer is the same as the material of the further photoresist layer.

20. The method of claim 8, in which the structure of the first photoresist layer is transferred by simultaneously removing both substrate and further photoresist layer after part of the first photoresist layer, exposed by the further opening in the further photoresist layer, has been fully removed.

21. A method for producing a substrate with a multi-structure, comprising the steps of:
   a) producing a substrate;
   b) depositing a first photoresist layer on top of the substrate;
   c) forming a first opening in the first photoresist layer by exposure through a first mask, development and post-baking of the first photoresist layer:
   d) positing a second photoresist layer on top of the existing first photoresist layer and on top of the substrate in the area of the first opening;

e) forming a second opening in the second photoresist layer by exposure through a second mask, development and postbaking, with said second opening overlying and being larger than the first opening:

f) transferring substantially all of the first opening to the substrate;

g) removing the first photoresist layer to the extent to which it is not covered by the overlying second photoresist layer and simultaneously removing substantially all of the second photoresist layer, wherein the first photoresist layer and second photoresist layer are removed by etching;

h) transferring the second opening to the substrate and simultaneously deepening the first opening in the substrate; and i) removing the first photoresist layer.

* * * * *

UNITED STATES PATENT AND TRADEMARK OFFICE
CERTIFICATE OF CORRECTION

PATENT NO. : 5,641,610
DATED : 06/24/97
INVENTOR(S) : J. Barth et al

It is certified that error appears in the above-indentified patent and that said Letters Patent is hereby corrected as shown below:

Column 5, line 53 - delete "exiting" and insert --existing--;

Column 6, line 10 - after "steps" insert -- of:--;
        line 64 - delete ":" and insert --;--;
        line 65 - delete "positing" and insert --depositing--;

Column 7, line 4 - delete ":" and insert --;--.

Signed and Sealed this

Fifth Day of January, 1999

Attest:

Attesting Officer      *Acting Commissioner of Patents and Trademarks*